United States Patent
Lu et al.

(10) Patent No.: US 10,684,181 B2
(45) Date of Patent: Jun. 16, 2020

(54) INTEGRATION OF PROXIMITY SENSORS WITH MAGNETOSTRICTIVE TORQUE SENSORS

(71) Applicant: Bently Nevada, LLC, Minden, NV (US)

(72) Inventors: Dan Tho Lu, Minden, NV (US); Lam Arthur Campbell, Houston, TX (US); Brian F. Howard, Minden, NV (US); Pekka Tapani Sipila, Garching Bei Munchen (DE); David Folkner, Greenville, SC (US); Lysle Turnbeaugh, Minden, NV (US)

(73) Assignee: Bently Nevada, LLC, Minden, NV (US)

( * ) Notice: Subject to any disclaimer, the term of this patent is extended or adjusted under 35 U.S.C. 154(b) by 213 days.

(21) Appl. No.: 15/864,627

(22) Filed: Jan. 8, 2018

(65) Prior Publication Data

US 2019/0212218 A1    Jul. 11, 2019

(51) Int. Cl.

| G01L 5/00 | (2006.01) |
|---|---|
| H01L 41/12 | (2006.01) |
| G01L 5/22 | (2006.01) |
| G01L 3/10 | (2006.01) |
| B62D 6/10 | (2006.01) |

(52) U.S. Cl.
CPC ............ *G01L 5/0042* (2013.01); *G01L 3/103* (2013.01); *G01L 5/22* (2013.01); *H01L 41/125* (2013.01); *B62D 6/10* (2013.01)

(58) Field of Classification Search
CPC ......... G01L 5/0042; G01L 3/103; G01L 5/22; B62D 6/10; H01L 41/125

USPC ................................................... 73/862.333
See application file for complete search history.

(56) References Cited

U.S. PATENT DOCUMENTS

| 5,389,004 A | 2/1995 | Gray et al. |
| 8,826,490 B1 | 9/2014 | Giarmo |
| 2004/0223803 A1 | 11/2004 | Fahy et al. |
| (Continued) | | |

OTHER PUBLICATIONS

International Search Report and Written Opinion issued in corresponding International Application No. PCT/US2019/017030, dated Apr. 26, 2019, 7 pages.

*Primary Examiner* — Max H Noori
(74) *Attorney, Agent, or Firm* — Mintz Levin Cohn Ferris Glovsky and Popeo, P.C.

(57) ABSTRACT

A gap compensated torque sensing system and methods for using the same are provided. The system can include a magnetostrictive torque sensor and at least one proximity sensor in communication with a controller. The proximity sensor can be substantially rigidly coupled to a sensor head of the torque sensor, either contained within the sensor head or mounted proximate to the sensor head using a bracket or other coupling mechanism. The torque sensor can sense magnetic flux passing through the target and the proximity sensor can measure a gap between itself and the target. The controller can estimate torque applied to the target from magnetic flux sensed by the torque sensor. The estimated torque can be modified by the gap measurement to compensate for changes in magnetic properties of the target due to variations in the gap. In this manner, the accuracy of the torque measurements can be increased.

17 Claims, 8 Drawing Sheets

(56) References Cited

U.S. PATENT DOCUMENTS

| | | | |
|---|---|---|---|
| 2010/0301840 A1* | 12/2010 | Filatov | G01B 7/003 324/207.11 |
| 2014/0338148 A1 | 11/2014 | Lee et al. | |
| 2016/0208981 A1 | 7/2016 | Kaesemeyer | |
| 2018/0052065 A1* | 2/2018 | Sipila | G01L 1/127 |
| 2019/0049320 A1* | 2/2019 | Lu | G01D 3/0365 |

* cited by examiner

INTEGRATION OF PROXIMITY SENSORS WITH MAGNETOSTRICTIVE TORQUE SENSORS

BACKGROUND

Sensors can be used in a variety of industries to monitor equipment. As an example, torque sensors can be used to monitor rotating machine components (e.g., shafts) and output signals representative of torque applied to the monitored components. By comparing measured torques to design specifications, it can be determined whether monitored components are operating within these specifications.

Magnetostrictive sensors are a type of sensor that employ magnetic fields for measuring mechanical stress (e.g., torque). As an example, a magnetostrictive torque sensor can generate a magnetic flux that permeates a shaft and it can measure the magnetic flux as it interacts with the shaft. The intensity of the measured magnetic flux can vary due to changes in torque applied to the shaft. Thus, magnetostrictive sensors can output signals representative of torques applied to the shaft based upon magnetic flux measurements.

SUMMARY

While the magnetic flux measured by a magnetostrictive torque sensor can depend upon the torque applied to a monitored component, such as a shaft, it can also depend upon a distance or gap separating the magnetostrictive torque sensor from the monitored component. As a result, torque measurements of a monitored component can also be sensitive to changes in this gap (e.g., due to vibrations) and they can deviate from actual torque on a shaft. For example, a non-ideal environment may introduce vibrations causing changes in the gap, which can affect the sensitivity and accuracy of measurements. Accordingly, systems and methods are provided for gap compensation of magnetostrictive sensors, such as torque sensors.

In one embodiment, a magnetostrictive sensing system is provided and it can include a magnetostrictive sensor and at least one proximity sensor. The magnetostrictive sensor can include a sensor head extending between a proximal end and a distal end. The sensor head can contain a driving pole and at least one sensing pole. The driving pole can have a driving coil coupled thereto that is configured to generate a first magnetic flux in response to a driving current. The at least one sensing pole can have a sensing coil coupled thereto that is configured to output a first signal based at least upon a second magnetic flux resulting from interaction of the first magnetic flux with a target. The at least one proximity sensor can be positioned within the sensor head and it can be secured to the distal end of the sensor head. The at least one proximity sensor can be distanced from the driving pole and the sensing pole and it can be configured to output a second signal based upon a gap between the distal end of the sensor head and the target.

In certain embodiments, the sensing system can include a controller in electrical communication with the sensor head. The controller can be configured to receive the first signal and the second signal and adjust the first signal to determine a gap compensated force applied to the target.

In another embodiment, the force can be a torque.

In another embodiment, the at least one proximity sensor can be positioned such that the first magnetic flux generated by the driving coil and the second magnetic flux measured by the sensing coil are each substantially unchanged by the proximity sensor.

In another embodiment, the at least one proximity sensor can include at least one of a laser proximity sensor, an optical proximity sensor, a capacitive proximity sensor, a radar proximity sensor, a microwave proximity sensor, and an eddy current proximity sensor.

In another embodiment, the sensing system can include at least two proximity sensors arranged approximately symmetrically with respect to the driving pole. The second signal can be a combination of signals generated by the at least two proximity sensors. As an example, the second signal can be an average of signals generated by the at least two proximity sensors.

In another embodiment, each of the at least two proximity sensors can be a sensor including at least one of a laser proximity sensor, an optical proximity sensor, a capacitive proximity sensor, a radar proximity sensor, a microwave proximity sensor, and an eddy current proximity sensor, where the first proximity sensor can be a different from the second proximity sensor.

In another embodiment, the at least two proximity sensors can be positioned between the driving pole and the sensing pole or between two sensing poles.

In yet another embodiment, a magnetostrictive sensing system is provided and it can include a magnetostrictive sensor and at least one proximity sensor. The magnetostrictive sensor can include a sensor head extending between a proximal end and a distal end. The sensor head can contain a driving pole and at least one sensing pole. The driving pole can have a driving coil coupled thereto that is configured to generate a magnetic flux in response to a driving current. The at least one sensing pole can have a sensing coil coupled thereto that is configured to output a first signal based at least upon a second magnetic flux resulting from interaction of the first magnetic flux with a target. The at least one proximity sensor can be positioned outside of the sensor head and it can be coupled substantially rigidly thereto. The at least one proximity sensor can be configured to output a second signal based upon a gap between the distal end of the sensor head and the target.

In certain embodiments, the sensing system can include a bracket configured to receive the sensor head and the at least one proximity sensor. The bracket can substantially rigidly couple the at least one proximity sensor to the sensor head.

In another embodiment, the sensing system can include a controller in electrical communication with the sensor head. The controller can be configured to receive the first signal and the second signal, determine a force applied to the target based upon the first signal, determine the gap based upon the second signal, and adjust the force determined from the first signal based upon the gap determined from the second signal.

In another embodiment, the force can be a torque.

In another embodiment, the at least one proximity sensor can be positioned such that the first magnetic flux generated by the driving coil and the second magnetic flux measured by the sensing coil are each substantially unchanged by the proximity sensor.

In another embodiment, the at least one proximity sensor includes at least one of a laser proximity sensor, an optical proximity sensor, a capacitive proximity sensor, a radar proximity sensor, a microwave proximity sensor, and an eddy current proximity sensor.

In another embodiment, the sensing system can include at least two proximity sensors arranged approximately symmetrically with respect to the driving pole. The second signal can be a combination of signals generated by the at least two proximity sensors. As an example, the second signal can be an average of signals generated by the at least two proximity sensors.

In another embodiment, each of the at least two proximity sensors can be a sensor including at least one of a laser proximity sensor, an optical proximity sensor, a capacitive proximity sensor, a radar proximity sensor, a microwave proximity sensor, and an eddy current proximity sensor, where the first proximity sensor is different from the second proximity sensor.

In another embodiment, the at least two proximity sensors can be positioned between the driving pole and the sensing pole.

DESCRIPTION OF DRAWINGS

These and other features will be more readily understood from the following detailed description taken in conjunction with the accompanying drawings, in which.

It is noted that the drawings are not necessarily to scale. The drawings are intended to depict only typical aspects of the subject matter disclosed herein, and therefore should not be considered as limiting the scope of the disclosure. Those skilled in the art will understand that the systems, devices, and methods specifically described herein and illustrated in the accompanying drawings are non-limiting exemplary embodiments and that the scope of the present invention is defined solely by the claims.

DETAILED DESCRIPTION

Torque is a twisting force that tends to cause an object to rotate. As an example, machine components such as shafts can be rotated by applying a torque. To ensure that the level of torque applied to a shaft is not too high, torque sensors can be used to measure torque applied to the shaft. Some torque sensors can be configured to measure torque without touching a shaft and can be referred to as non-contacting torque sensors. One type of non-contacting torque sensor, referred to as a magnetostrictive torque sensor, can use magnetic signals to measure torque applied to a shaft. However, magnetostrictive torque sensors can be highly sensitive to changes in the gap distance between itself and the shaft. If the gap distance changes while it makes torque measurements, which can occur due to vibrations, these gap distance changes can introduce error into the torque measurements. To improve the quality of the torque measurements, gap distance changes can be measured and used to adjust the torque measurements to reduce errors due to the gap distance changes. Accordingly, improved gap compensation measurements are provided for use with magnetostrictive torque sensors to enhance the accuracy of torque measurements.

Embodiments of sensing systems and corresponding methods for measuring torque of rotating machine components are discussed herein. However, embodiments of the disclosure can be employed to measure other forces applied to rotating or stationary machine components without limit.

Figure 1:
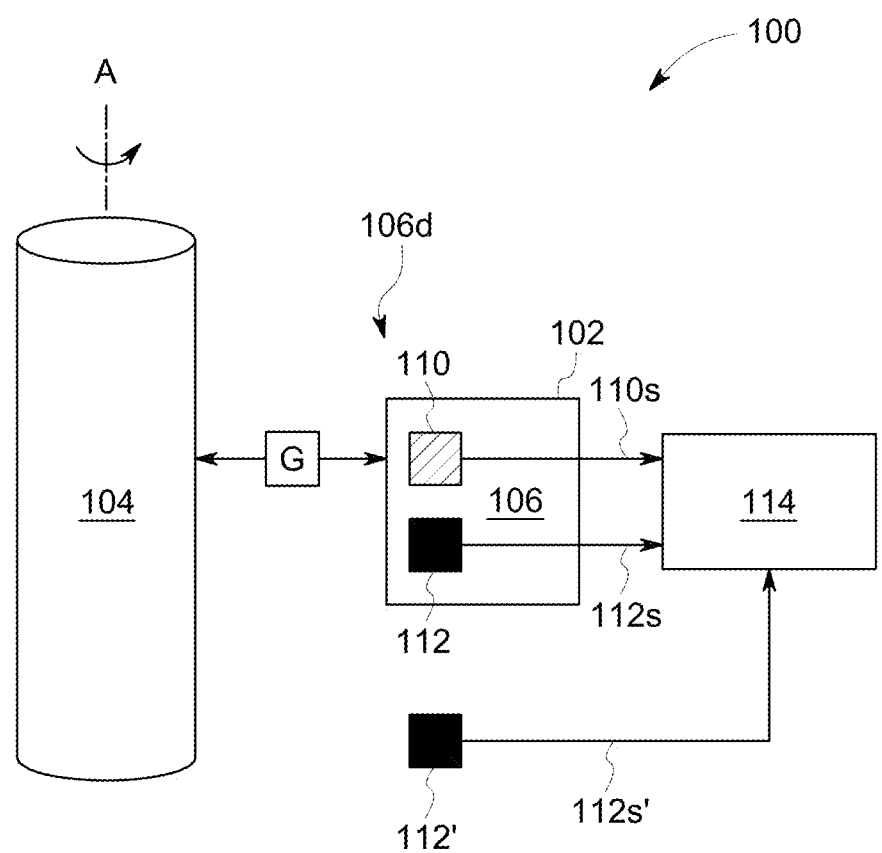
FIG. 1 is a diagram illustrating one exemplary embodiment of an operating environment including a gap compensated torque sensing system having a magnetostrictive torque sensor and at least one proximity sensor.

FIG. 1 illustrates one exemplary embodiment of an operating environment 100 containing a gap compensated torque sensing system 102 and a target 104. The gap compensated torque sensing system 102 can be a magnetostrictive torque sensing system including a sensor head 106, a torque sensor 110, a proximity sensor (e.g., 112 or 112'), and a controller 114. The torque sensor 110 can be positioned within the sensor head 106 and it can be configured to generate one or more first signals 110s representative of torque applied to a selected portion of the target 104. In certain embodiments, the proximity sensor can also be positioned within the sensor head 106 (e.g., proximity sensor 112). In other embodiments, the proximity sensor can be positioned outside of the sensor head 106 (e.g., proximity sensor 112'). In either case, each of the proximity sensors 112, 112' can be substantially rigidly coupled to the sensor head 106 and each can be configured to generate respective second signals (e.g., 112s, 112s') representative of a gap (e.g., G) between a distal end 106d of the sensor head 106 and the selected portion of the target 104.

In use, the sensor head 106 can be positioned proximate to the target 104 for acquiring torque measurements. Similarly, the proximity sensors 112 or 112' can be positioned proximate to the target 104 for acquiring gap measurements. The controller 114 can be configured to receive the first signals 110s and the second signals 112s or 112s'. The controller 114 can be further configured to determine a torque applied to the target 104 that is adjusted to compensate for changes in the gap G. As an example, the controller 114 can be configured to the adjust the first signals 110s using the second signals 112s or 112s' and calculate the gap-compensated torque from the adjusted first signals 110s. In this manner, the torque measurements can be compensated for changes in the gap G (e.g., due to vibration of the target 104), improving the accuracy of the torque measurements.

In certain embodiments, the sensor head 106 can be coupled to a frame or other stationary fixture (not shown) to position the sensor head 106 at a desired orientation and/or position with respect to the target 104. In further embodiments, when the proximity sensor is positioned outside of the sensor head 106 (e.g., proximity sensor 112'), it can be substantially rigidly coupled to the sensor head 106 via a bracket or other coupling mechanism (not shown). In other embodiments, the torque and gap measurements can be acquired from the target 104 while the target 104 is rotating (e.g., about a longitudinal axis A) or while the target is stationary. Other embodiments are within the scope of the disclosed subject matter.

Figure 2:
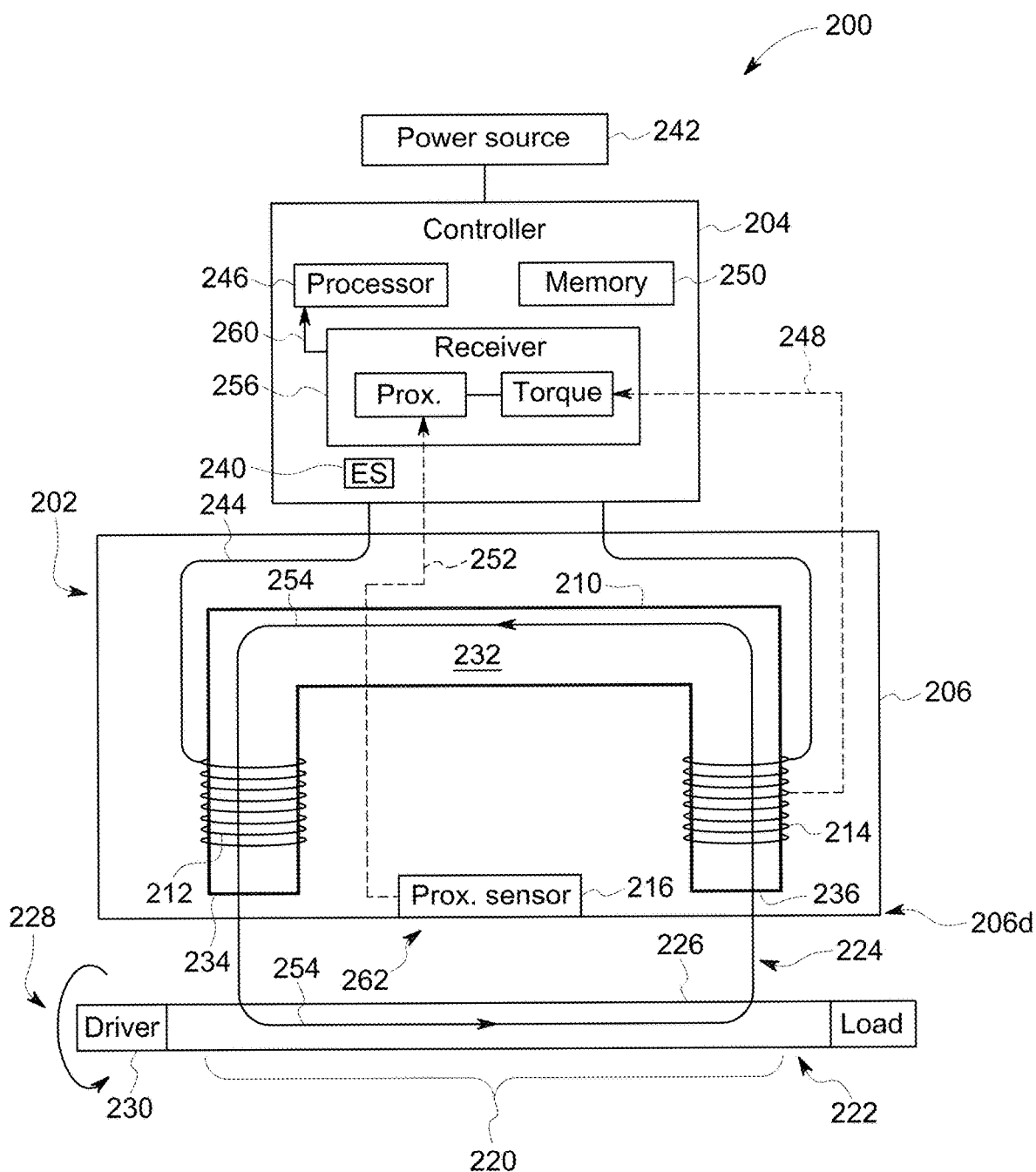
FIG. 2 is a side cross-sectional view of one exemplary embodiment of the gap compensated torque sensing system of FIG. 1 including a magnetostrictive torque sensor in communication with at least one proximity sensor mounted within a housing of the magnetostrictive torque sensor.

FIG. 2 is a side cross-sectional view of one exemplary embodiment of a gap compensated torque sensing system 200 that includes a sensor head 202 in electrical communication with a controller 204. The sensor head 202 can form a housing 206 that contains a torque sensor including a core 210, a driving coil 212, and at least one sensing coil 214. As shown, the sensor head 202 can also include at least one proximity sensor 216 positioned therein. As discussed in greater detail below, the torque sensor can be configured to output signals (e.g., torque signals 248) characterizing torque applied to a selected portion 220 of a target 222 (e.g., a portion of the target 222 positioned opposite the sensor head 202). The proximity sensor 216 can be configured to output signals (e.g., proximity signals 252) characterizing a gap 224 between the distal end 206*d* of the housing 206 and a surface 226 of the selected portion 220 of the target 222. Characterization of the gap 224 by the proximity sensor 216 can be made substantially concurrently with characterization of the torque by the torque sensor.

The target 222 can be a component of any machine or equipment 228 that is configured to rotate. Examples of rotating components can include, but are not limited to, shafts and rotors. Examples of machines and equipment 228 incorporating rotating components can include, but are not limited to, turbomachines (e.g., turbine engines, compressors, pumps, and combinations thereof), generators, combustion engines, and combinations thereof. Force or load can be applied to the target 222 by a driver 230 (e.g., a reciprocating engine, a combustion engine, a turbine engine, an electrical motor, etc.) to enable the target 222 to rotate and drive a load. The target 222 can be formed from materials including, but not limited to, ferromagnetic materials such as iron, steel, nickel, cobalt, and alloys thereof. In certain embodiments, the target 222 can be non-magnetized. In other embodiments, the target 222 can be magnetized.

The core 210 can include a base 232 and at least two elongated poles 234, 236. The poles 234, 236 can extend outwards from the base 232 and they can be separated from one another by a selected distance. The core 210 can be formed from any ferromagnetic material. Examples can include, but are not limited to, iron, steel, nickel, cobalt, and alloys thereof. One of the poles 234 can be a driving pole to which the driving coil 212 is wrapped around. The other of the poles 236 can be a sensing pole to which the sensing coil 214 is wrapped around.

The driving coil 212 and the sensing coil 214 can each be in electrical communication with the controller 204. As shown in FIG. 2, the controller 204 can be electrically coupled to an excitation source ES 240 by wired or wireless connections. Wireless communication devices, such as radio frequency (RF) transmitters, can be integrated with the controller 204 to transmit the signals to an RF receiver integrated with the excitation source ES 240. As also shown in FIG. 2, the controller 204 can be positioned remotely from the sensor head 202. However, in alternative embodiments (not shown), the controller 204 can be positioned within the sensor head 202.

A power source 242 (e.g., electrical outlets, electrical generators, batteries, etc.) can provide power to the controller 204 and to the excitation source ES 240. The excitation source ES 240 can be configured to deliver a driving current 244 (e.g., an AC current) to the driving coil 212. The controller 204 can be configured to control characteristics (e.g., frequency, amplitude, etc.) of the driving current 244. The controller 204 can be any computing device employing a general purpose or application-specific processor 246. In either case, the controller 204 can include memory 250 for storing instructions related to characteristics of the driving current 244, such as frequency, amplitude, and combinations thereof. The memory 250 can also include instructions and algorithms for adjusting the torque signals 248 based on the proximity signals 252. In certain embodiments, the memory 250 can also include instructions and algorithms for converting the torque signals 248 adjusted by the proximity signals 252 into torque measurements. The processor 246 can include one or more processing devices, and the memory 250 can include one or more tangible, non-transitory, machine-readable media collectively storing instructions executable by the processor 246 to perform the methods and control actions described herein. Embodiments of the controller 204 can be implemented using analog electronic circuitry, digital electronic circuitry, and/or combinations thereof.

The driving current 244 can pass through the driving coil 212 to generate a magnetic flux 254. The magnetic flux 254 can permeate the target 222, pass through the sensing coil 214, and return to the driving coil 212 via the core 210 (e.g., the base 232 and the sensing pole 236). In this manner, a magnetic loop can be formed through the torque sensor and the target 222.

The sensing coil 214 can be used to measure the magnetic flux 254 exiting the target 222. Because force (e.g., compression, tension, torsion, etc.) applied to the target 222 can change the magnetic permeability of the target 222, the magnetic flux 254 measured by the sensing coil 214 can change. Thus, the torque applied to the target 222 can be determined based on the change in magnetic flux 254 received by the sensing coil 214 relative to the magnetic flux 254 generated by the driving coil 212. The sensing coil 214 can be configured to transmit a torque signal 248 to the controller 204 that is indicative of the changes (e.g., difference) in the magnetic flux 254.

The torque signal 248 can be communicated by wired or wireless connections to the controller 204 (e.g., receiver 256). As an example, wireless communication devices, such as RF transmitters, can be integrated with the sensor head 202 (e.g., proximate to the sensing coil 214) to transmit the signals to an RF receiver integrated with the controller 204. The receiver 256 can include electronic components (e.g., amplifiers, filters, etc.) that can condition the torque signal 248 before transmitting the torque signal 248 to the processor 246. In other embodiments, the torque signal 248 can be conditioned after being processed by the processor 246.

As discussed above, the magnetic flux 254 measured by the sensing coil 214 can be affected by the gap 224, which can extend between the distal end 206*d* of the housing 206 and a surface 226 of the target 222. Thus, torque measurements determined for the target 222 based upon the magnetic flux 254 sensed by the sensing coil 214 can deviate from the actual torque applied to the target 222. To address this issue, the gap 224 can be measured by the proximity sensor 216. This gap measurement can be used to adjust the estimated torque measurements to account for variations in the gap 224. In this manner, the proximity sensor 216 can improve the accuracy of the torque measurements and enable better control of the machine or equipment 228 incorporating the target 222.

The position of the proximity sensor 216 relative to the torque sensor and the target 222 can be selected to facilitate both the magnetic flux measurements acquired by the torque sensor and the gap measurements acquired by the proximity sensor 216. If the proximity sensor 216 is positioned too close to the target 222, the magnetic flux 254 generated by driving coil 212 can interact with the proximity sensor 216 to a degree that perturbs the magnetic flux 254 sensed by the sensing coil 214. Alternatively, if the proximity sensor 216 is positioned too far from the target 222, errors in the gap 224 measured by the proximity sensor 216 can increase to unacceptable levels. Furthermore, if the proximity sensor 216 is not sufficiently coupled to the torque sensor (e.g., via the sensor head 202), vibrations and/or other sources of gap variation can be experienced differently by the torque sensor and the proximity sensor 216 can measure a gap different from the gap 224 relevant to the torque measurements.

To address these considerations, the proximity sensor 216 can be positioned at a location within a magnetic neutral region 262 of the sensor head 202. The magnetic neutral region 262 can be any region of the sensor head 202 that exhibits a magnetic permeability less than the poles 234, 236 and the target 222, and that does not directly contact the target 222. That is, a greater fraction of the magnetic flux 254 can be present outside the magnetic neutral region 262 than within the magnetic neutral region 262, decreasing the likelihood of undesirable perturbation of the magnetic flux 254 by the proximity sensor 216. In an embodiment, the magnetic neutral region 262 can be located between the driving pole 234 and the sensing pole 236, between different sensing poles 234, or between the driving pole 234 and the housing 206.

The proximity sensor 216 can also be positioned within the magnetic neutral region 262 at a location that facilitates coupling to the torque sensor. As shown in FIG. 2, the proximity sensor 216 is secured to a distal end 206d of the housing 206 (e.g., on an inner surface of the housing 206) between the driving pole 234 and the sensing pole 236. While a single proximity sensor 216 is illustrated, as discussed in greater detail below, further embodiments of the gap compensated torque sensing system 200 can include two or more proximity sensors 216 positioned within the magnetic neutral region 262 and secured on or adjacent to an inner surface of the housing 206.

The proximity signal 252 can be communicated by wired or wireless connections to the controller 204 (e.g., receiver 256). As an example, wireless communication devices, such as RF transmitters, can be integrated with the sensor head 202 (e.g., proximate to the sensing coil 214) to transmit the signals to an RF receiver integrated with the controller 204. The receiver 256 can include electronic components (e.g., amplifiers, filters, etc.) that can condition the proximity signal 252 before transmitting the proximity signal 252 to the processor 246. In other embodiments, the torque signal 248 can be conditioned after being processed by the processor 246.

The proximity sensor 216 can be a non-contact sensor that is configured to measure the gap 224 without direct contact with the target 222. Examples of the proximity sensor 216 can include, but are not limited to, laser proximity sensors, optical proximity sensors, capacitive proximity sensors, radar proximity sensors, microwave proximity sensors, and eddy current proximity sensors. The proximity sensor 216 can also include voltage or current sensing circuitry configured to output the proximity signal 252 (e.g., a voltage signal or a current signal) to the controller 204 for processing.

The proximity signal 252 can be used to adjust the torque signal 248 in the receiver 256, thereby generating a combined signal 260. The receiver 256 can include electronic components (e.g., amplifiers, filters, etc.) that can condition the proximity signal 252 before transmitting the proximity signal 252 to the processor 246. In other embodiments, the proximity signal 252 can be conditioned after being processed by the processor 246. Similar to the torque signal 248 from the sensing coil 214, the proximity signal 252 can also be conditioned with electronic components, such as amplifiers, filters, or the like, before or after combining with the torque signal 248 or processed by the processor 246. Additionally, in certain embodiments, the signals 248, 252 can be combined in the processor 246, rather than in the receiver 256.

The memory 250 can include instructions and algorithms executable by the processor 246 to adjust the torque signal 248 using the proximity signal 252 and process the adjusted torque signal to calculate a gap-compensated torque applied to the target 222. That is, the processor 246 can execute pre-stored and/or user-defined algorithms in the memory 250 to calculate the magnitude of the torque applied to the target 222 based on the characteristics of the target 222, the sensor head 202, the driving current 244, and the gap 224.

Figure 3:
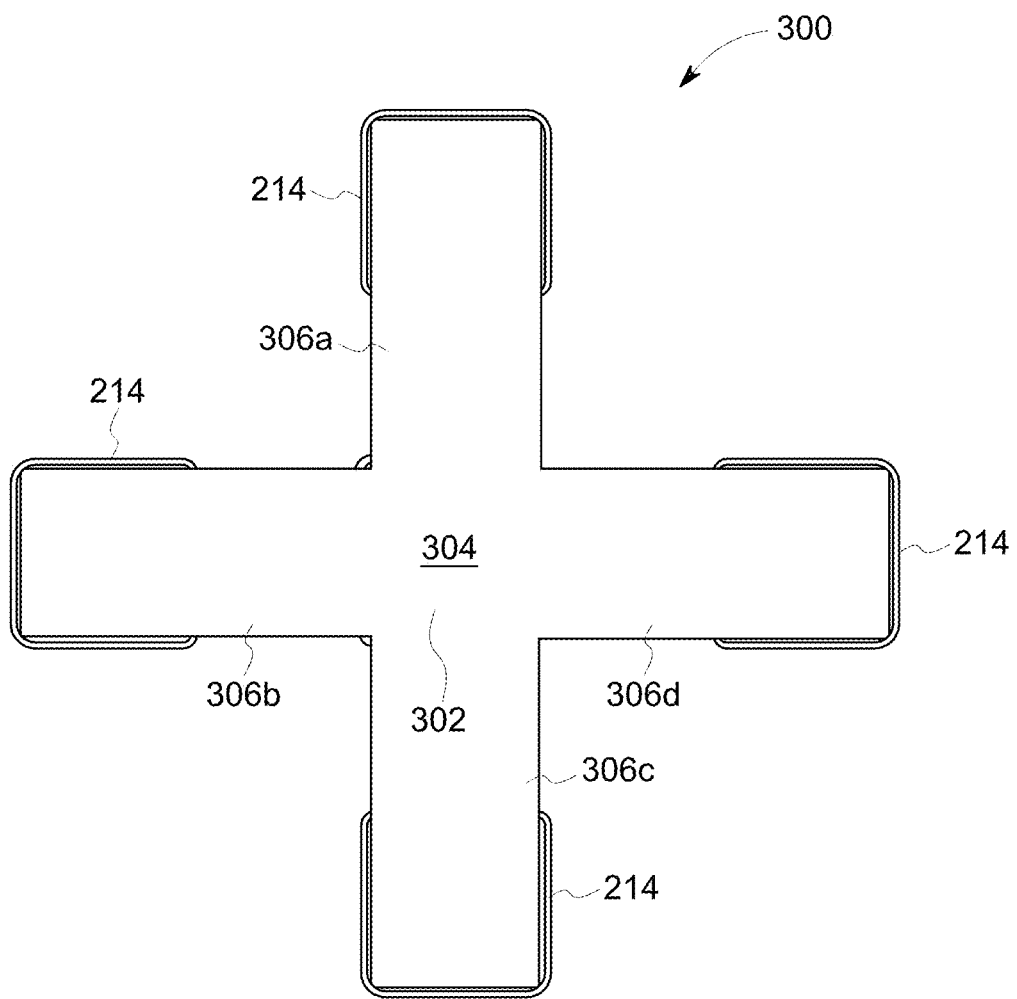
FIG. 3 is a top view of an exemplary embodiment of a core of the magnetostrictive torque sensor of FIG. 2.

FIG. 3 is a top view of an exemplary embodiment of a torque sensor including a core 300 having a cross axis yoke 302 with a cross yoke portion 304. Four bases 306a, 306b, 306c, 306d of the cross axis yoke 302 can extend radially outward in a plane from the cross yoke portion 304. The four bases 306a, 306b, 306c, 306d can be substantially orthogonal to each other around the cross yoke portion 304. Each of the four bases 306a, 306b, 306c, 306d can extend from the cross yoke portion 304 in any configuration and for any length that enables each to operate as described herein. In some embodiments, the cross axis yoke 302 can have any number of members, such as 1, 2, 3, 4, 5, 6, 7, 8, 9, 10, or more extending radially from the cross yoke portion 304. The bases 306a, 306b, 306c, 306d can be angularly spaced apart by an angle ranging from about 10 degrees to 135 degrees (e.g., 10 degrees, 20 degrees, 30 degrees, 40 degrees, 45 degrees, 60 degrees, 75 degrees, 90 degrees, 120 degrees, 135 degrees, or any combination thereof). As shown in FIG. 3, the bases 306a, 306b, 306c, 306d can be angularly spaced apart by approximately 90 degrees. Additional embodiments of the core 300 and the torque sensor are discussed in U.S. Pat. No. 9,618,408, the entirety of which is hereby incorporated by reference.

Figure 4A:
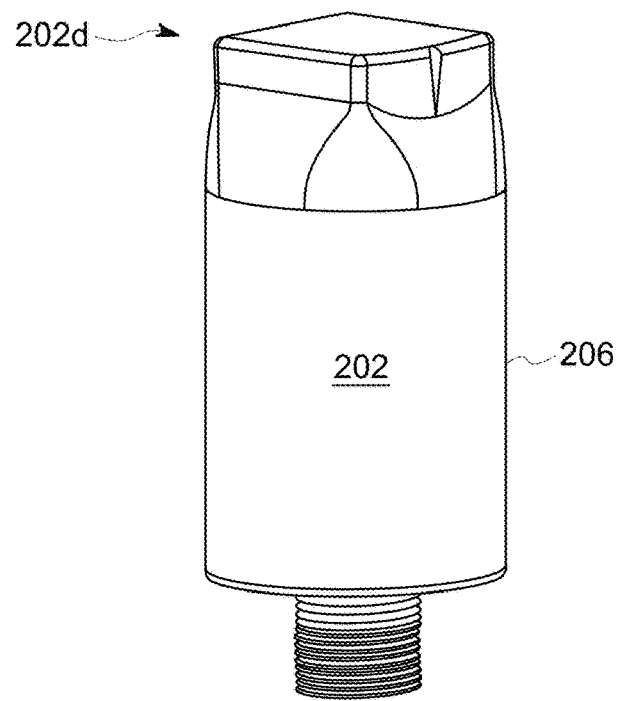
FIG. 4A is a perspective view of an exemplary embodiment of a housing of the magnetostrictive torque sensor of FIG. 2.
Figure 4B:
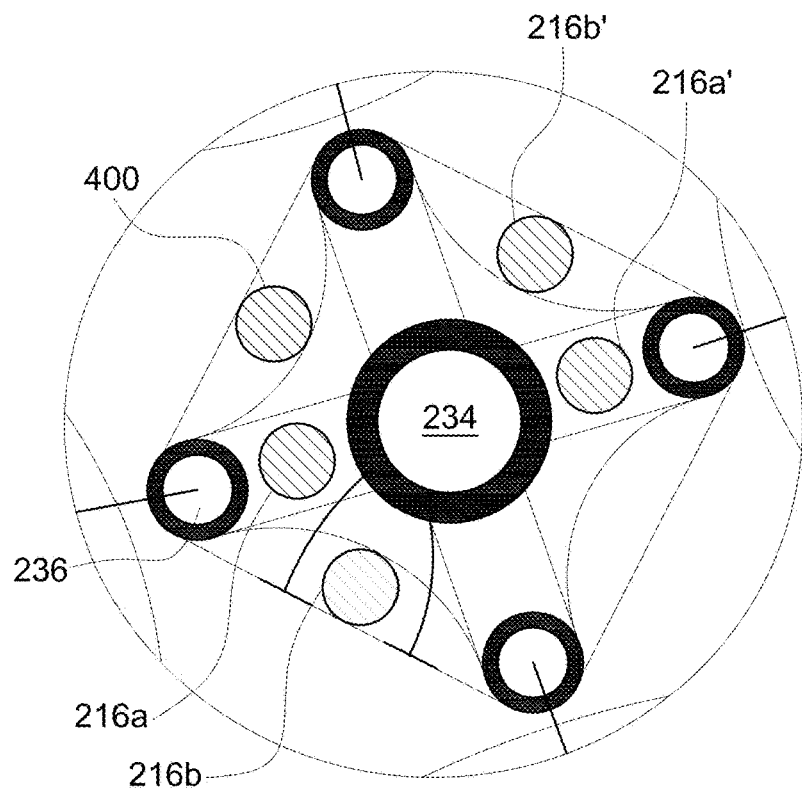
FIG. 4B is a transparent top view of a distal end of the housing of FIG. 4A illustrating proximity sensors mounted to an interior face of a distal end of the housing.

FIGS. 4A-4B illustrate the sensor head 202 and placement of at least one proximity sensor 216 within the sensor head 202. As shown in FIG. 4A, at least a portion of the distal end 202d of the sensor head 202 can be approximately flat. As further shown in FIG. 4B, the proximity sensor 216 can be coupled to an inner face 400 of the distal end 202d of the sensor head 202. The placement of the proximity sensor 216 can be within the magnetic neutral region 262 of the torque sensor. In one aspect, at least one proximity sensor (e.g., proximity sensor 216a) can be positioned between the driving pole 234 and one of the sensing poles 236. In another aspect, at least one proximity sensor (e.g., proximity sensor 216b) can be positioned between respective sensing poles 236.

When two or more proximity sensors 216 are present, they can be arranged substantially symmetrically about the driving pole 234. As an example, either of the proximity sensors 216a, 216b can be paired with a corresponding proximity sensor 216a', 216b', respectively, that is positioned on an opposing side of the driving pole 234. Additionally, respective proximity sensing signals 252 output by proximity sensor pairs (e.g., 216a and 216a', 216b, and 216') can be combined to determine the gap 224. As an example, the proximity sensing signals 252 output by proximity sensor pairs (e.g., 216a and 216a', 216b and 216') can be averaged. By combining the gap measurements obtained more than one proximity sensor, gap measurement errors associated with a single proximity sensor 216 can be reduced.

Figure 5:
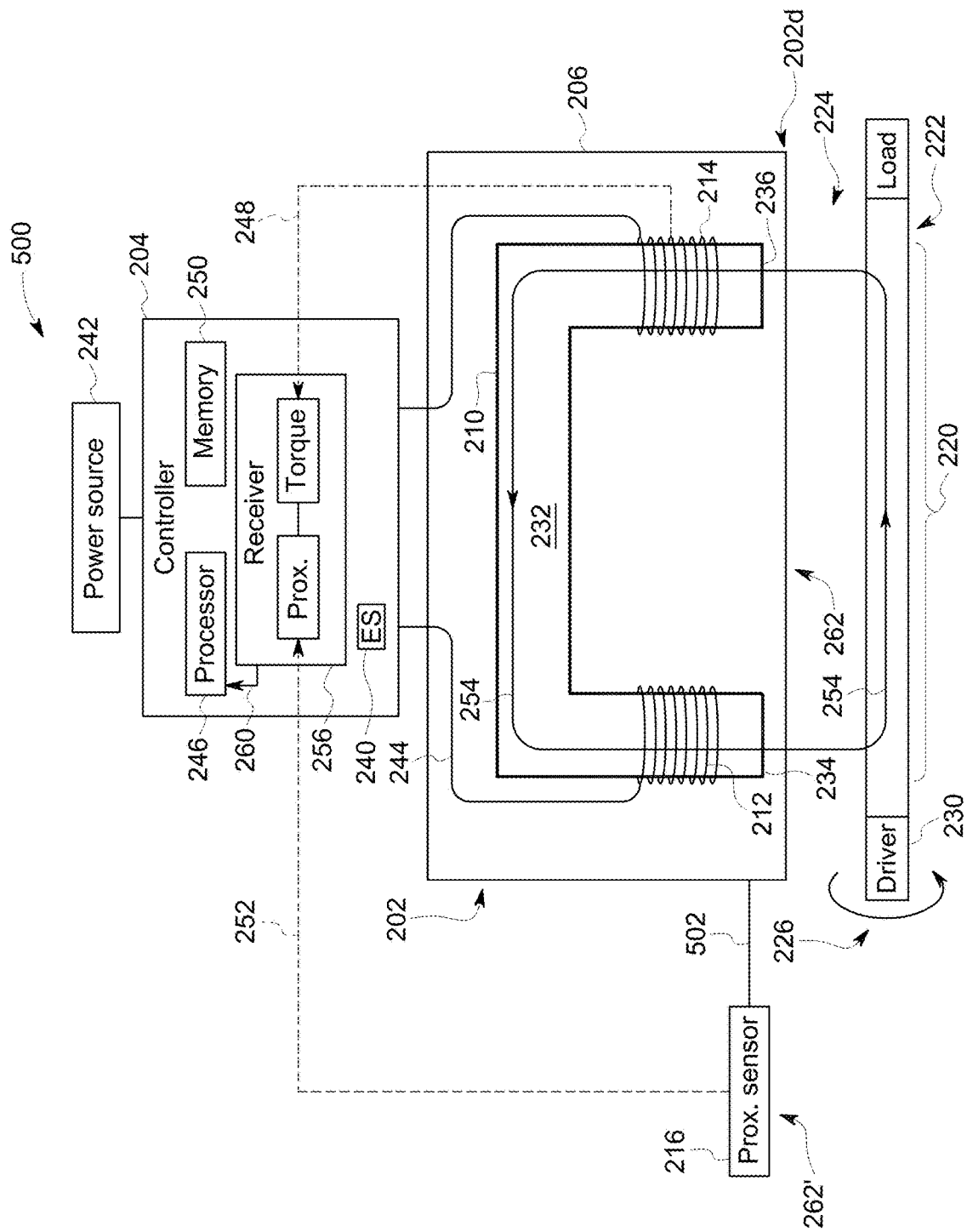
FIG. 5 is a side cross-sectional view of another exemplary embodiment of the gap compensated torque sensing system of FIG. 1 including a magnetostrictive torque sensor in communication with at least one proximity sensor coupled to the magnetostrictive torque sensor outside of its housing.

FIG. 5 is a side cross-sectional view illustrating another exemplary embodiment of a gap compensated torque sensing system 500. The gap compensated torque sensing system 500 can be similar to the gap compensated torque sensing system 200 of FIG. 2 except that it can include one or more proximity sensors 216 that is positioned outside of the sensor head 202 and mechanically coupled thereto by a bracket 502. The bracket 502 can position the proximity sensor 216 in a magnetic neutral region 262' and is illustrated in greater detail in FIGS. 6A-7.

Figure 6A:
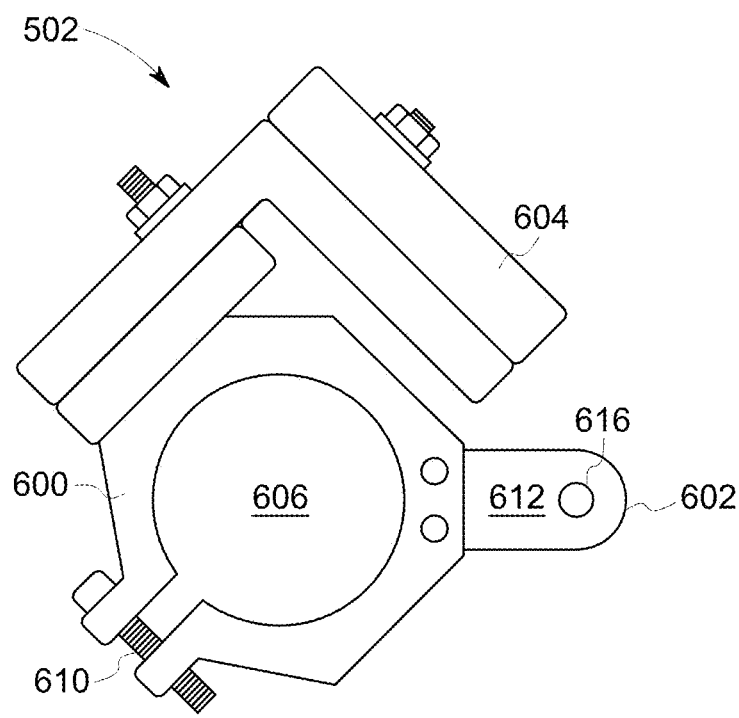
FIG. 6A is a top-down view of a bracket configured to receive the magnetostrictive sensor and the at least one proximity sensor.
Figure 6B:
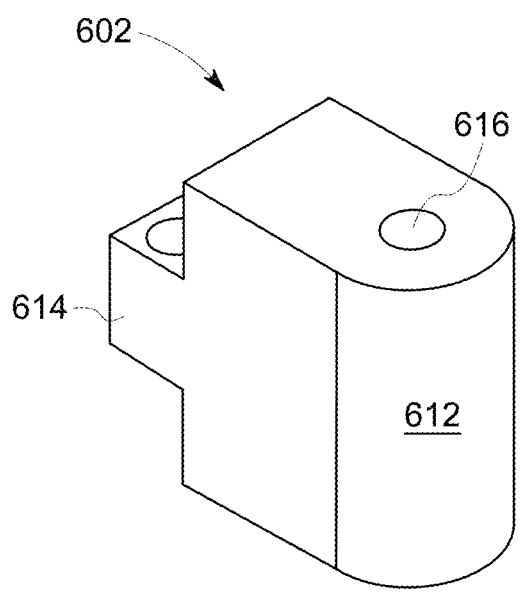
FIG. 6B is a perspective view of a holder of the bracket of FIG. 6A configured to receive a proximity sensor.

As shown in FIGS. 6A-6B, the bracket 502 can include a first portion 600, a second portion 602, and a mount 604. The first portion 600 can include a first opening 606 configured to receive the sensor head 202. A diameter of the first opening 606 can be adjusted by a locking mechanism 610 (e.g., a bolt) to secure the sensor head 202 within the first opening 606. The second portion 602 can include a body 612 having a projecting notch 614 for connecting the body 612 to the first portion 600. The body 612 can further include a second opening 616 configured to receive at least a portion of the proximity sensor 216. The second opening 616 can be configured to secure the proximity sensor 216 thereto by a friction fit or other securing mechanism. So configured, when the sensor head 202 and the proximity sensor 216 are secured to the bracket 502, the torque sensor and the proximity sensor 216 can be substantially rigidly coupled to one another.

Figure 7:
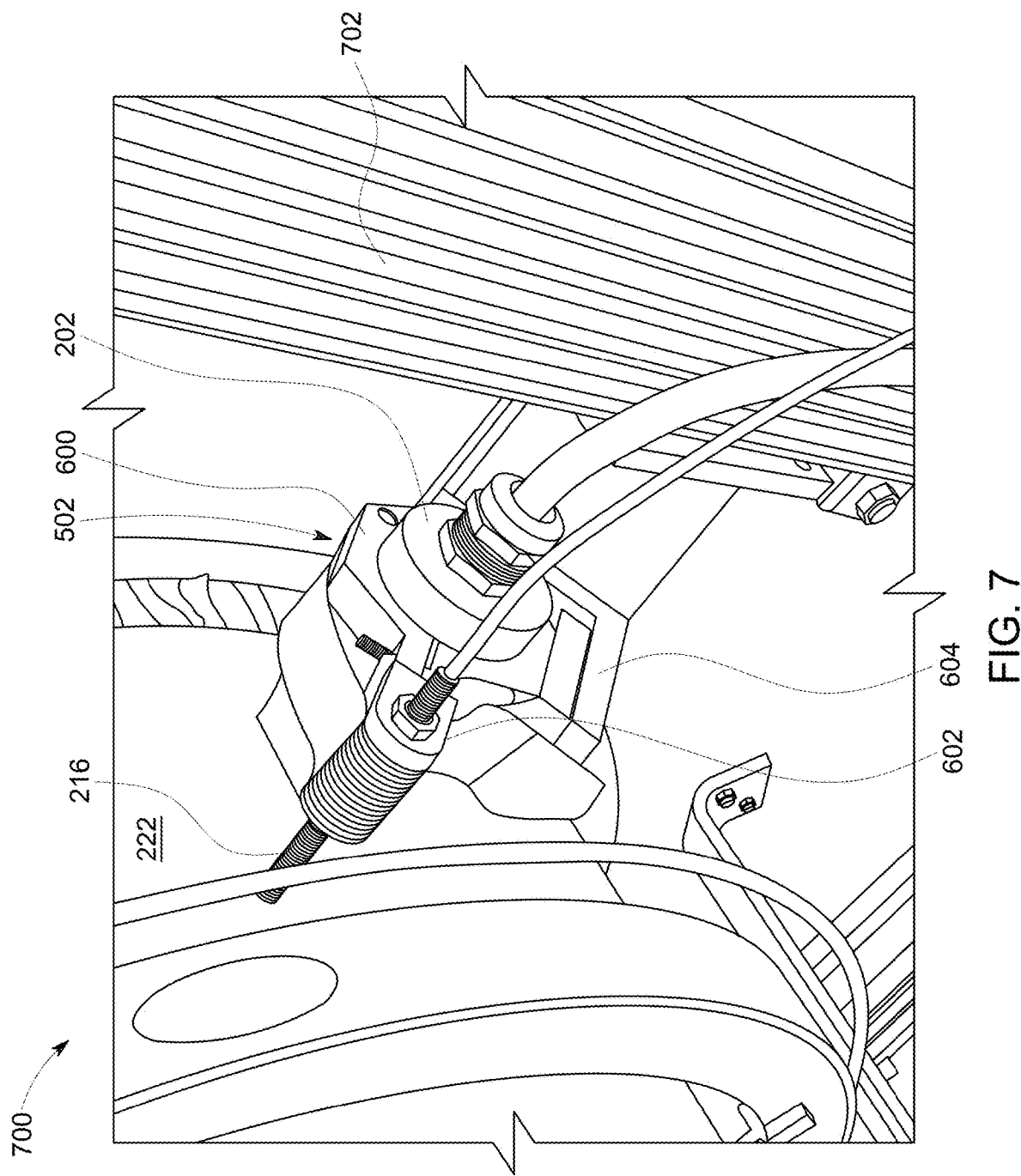
FIG. 7 is a perspective view of one exemplary embodiment of an operating environment including the gap compensated torque sensing system of FIG. 5 having a magnetostrictive torque sensor rigidly coupled to a proximity sensor by a bracket and positioned with respect to a target.

FIG. 7 illustrates one exemplary embodiment of an operating environment 700 including the gap compensated torque sensing system 500 of FIG. 5 with the sensor head 202 rigidly coupled to the proximity sensor 216 by the bracket 502. As shown, the mount 604 can be connected to the first portion 600 and configured to secure the bracket 502 to a supporting frame 702 to position the sensor head 202 and the proximity sensor 216 with respect to the target 222.

Figure 8:
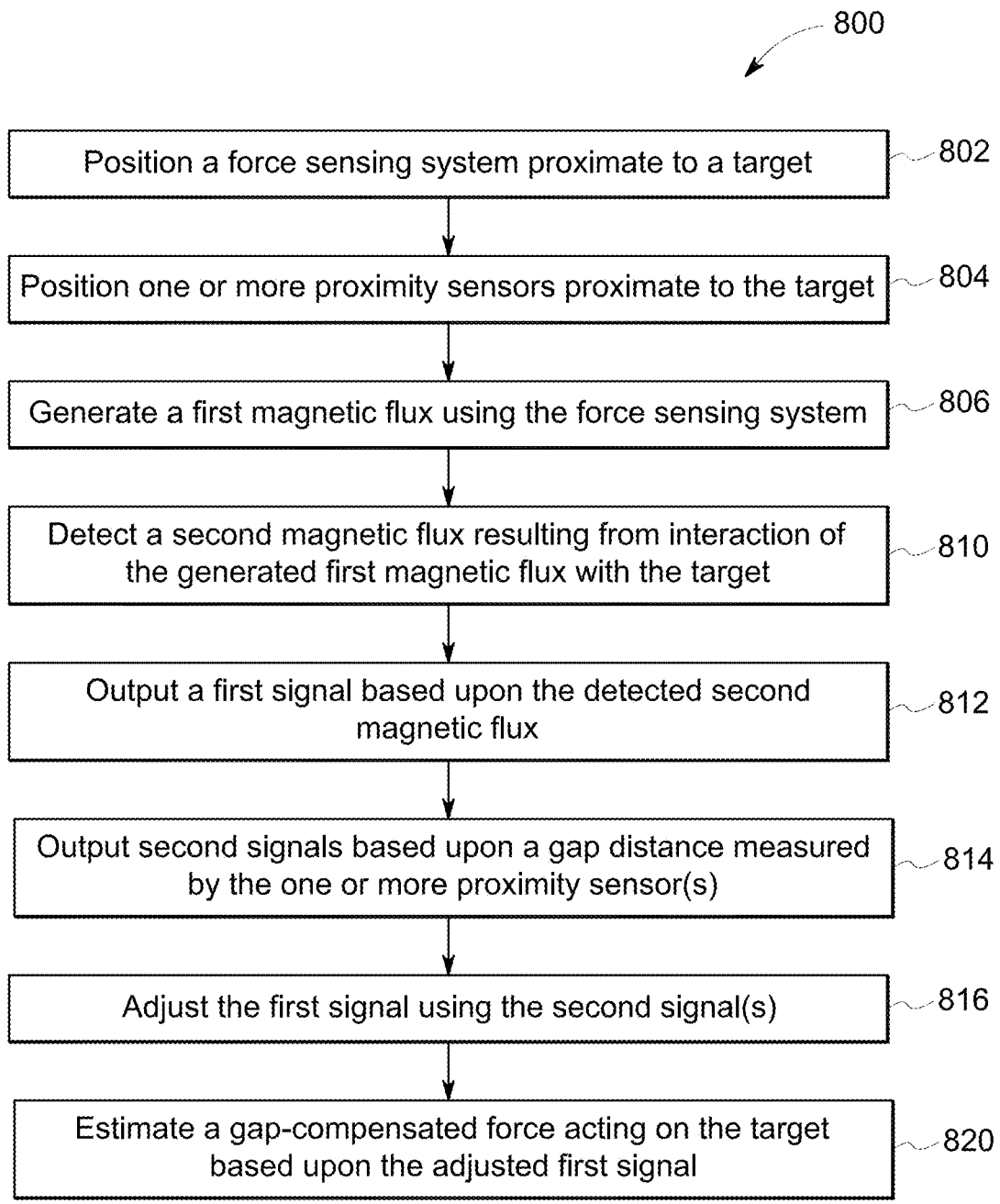
FIG. 8 is a flow diagram illustrating an exemplary embodiment of a method for measuring torque and proximity of a target.

FIG. 8 is a flow diagram illustrating an exemplary embodiment of a method 800 for measuring force (e.g., torque) and proximity of a target (e.g., 222) using any of the torque sensing systems discussed herein. The method 800 is described below in connection with the gap compensated torque sensing system 200 of FIG. 2. However, the method 800 is not limited to use with the gap compensated torque sensing system 200 and it can be employed with any magnetostrictive torque sensor. In certain aspects, embodiments of the method 800 can include greater or fewer operations than illustrated in FIG. 8 and can be performed in a different order than illustrated in FIG. 8.

In operation 802, a force sensing system (e.g., the gap compensated torque sensing system 200) can be positioned proximate to a target (e.g., 222). As an example, the gap compensated torque sensing system 200 can be secured to the bracket 502 or another mounting fixture.

In operation 804, at least one proximity sensor 216 can be positioned proximate to the target 222. When the proximity sensor 216 is positioned within the sensor head 202, the proximity sensor 216 can be positioned concurrently with the force sensing system. When the proximity sensor 216 is positioned outside of the sensor head 202, the proximity sensor 216 can be secured to the bracket 502. In operation 806, a first magnetic flux can be generated by the force sensing system (e.g., by the torque sensor using driving coil 212) and directed through the target 222 and the sensing pole 236. In operation 810, a second magnetic flux resulting from interaction of the first magnetic flux with the target 222 can be detected by the force sensing system (e.g., by the torque sensor with sensing coil 214). In operation 812, a first signal (e.g., the torque signal 248) can be output by the torque sensor based upon the second magnetic flux. In operation 814, at least one second signal (e.g., the proximity signal 252) can be output by each proximity sensor 216 based upon the gap 224. In operation 816, the torque signal 248 can be adjusted by the proximity signal 252. In operation 820, a gap-compensated force (e.g., torque) applied to the target 222 can be estimated based upon the adjusted torque signal.

Exemplary technical effects of the methods, systems, and devices described herein include, by way of non-limiting example, improved magnetostrictive torque measurements. Integration of one or more proximity sensors with a magnetostrictive torque sensing system can reduce error in magnetostrictive torque measurements of a target material due to changes in the gap separating the magnetostrictive torque sensing system from the target material. Gap measurements acquired by the proximity sensor can be used to compensate torque measurements acquired by the magnetostrictive torque sensor. This gap compensation can allow the magnetostrictive torque sensor to operate within non-ideal environments where vibrations can cause gap changes and thereby maintain sensitivity and accuracy. Two or more different proximity sensors can also be used to acquire gap measurements. These gap measurements can be combined to improve the accuracy of the gap measurement used to compensate the torque measurements, thereby improving the accuracy of the torque measurements.

The subject matter described herein can be implemented in analog electronic circuitry, digital electronic circuitry, and/or in computer software, firmware, or hardware, including the structural means disclosed in this specification and structural equivalents thereof, or in combinations of them. The subject matter described herein can be implemented as one or more computer program products, such as one or more computer programs tangibly embodied in an information carrier (e.g., in a machine-readable storage device), or embodied in a propagated signal, for execution by, or to control the operation of, data processing apparatus (e.g., a programmable processor, a computer, or multiple computers). A computer program (also known as a program, software, software application, or code) can be written in any form of programming language, including compiled or interpreted languages, and it can be deployed in any form, including as a stand-alone program or as a module, component, subroutine, or other unit suitable for use in a computing environment. A computer program does not necessarily correspond to a file. A program can be stored in a portion of a file that holds other programs or data, in a single file dedicated to the program in question, or in multiple coordinated files (e.g., files that store one or more modules, sub-programs, or portions of code). A computer program can be deployed to be executed on one computer or on multiple computers at one site or distributed across multiple sites and interconnected by a communication network.

The processes and logic flows described in this specification, including the method steps of the subject matter described herein, can be performed by one or more programmable processors executing one or more computer programs to perform functions of the subject matter described herein by operating on input data and generating output. The processes and logic flows can also be performed by, and apparatus of the subject matter described herein can be implemented as, special purpose logic circuitry, e.g., an FPGA (field programmable gate array) or an ASIC (application-specific integrated circuit).

Processors suitable for the execution of a computer program include, by way of example, both general and special purpose microprocessors, and any one or more processor of any kind of digital computer. Generally, a processor will receive instructions and data from a read-only memory or a random access memory or both. The essential elements of a computer are a processor for executing instructions and one or more memory devices for storing instructions and data. Generally, a computer will also include, or be operatively coupled to receive data from or transfer data to, or both, one or more mass storage devices for storing data, e.g., magnetic, magneto-optical disks, or optical disks. Information carriers suitable for embodying computer program instructions and data include all forms of non-volatile memory, including by way of example semiconductor memory devices, (e.g., EPROM, EEPROM, and flash memory devices); magnetic disks, (e.g., internal hard disks or removable disks); magneto-optical disks; and optical disks (e.g., CD and DVD disks). The processor and the memory can be supplemented by, or incorporated in, special purpose logic circuitry.

To provide for interaction with a user, the subject matter described herein can be implemented on a computer having a display device, e.g., a CRT (cathode ray tube) or LCD (liquid crystal display) monitor, for displaying information to the user and a keyboard and a pointing device, (e.g., a mouse or a trackball), by which the user can provide input to the computer. Other kinds of devices can be used to provide for interaction with a user as well. For example, feedback provided to the user can be any form of sensory feedback, (e.g., visual feedback, auditory feedback, or tactile feedback), and input from the user can be received in any form, including acoustic, speech, or tactile input.

The techniques described herein can be implemented using one or more modules. As used herein, the term "module" refers to computing software, firmware, hardware, and/or various combinations thereof. At a minimum, however, modules are not to be interpreted as software that is not implemented on hardware, firmware, or recorded on a non-transitory processor readable recordable storage medium (i.e., modules are not software per se). Indeed "module" is to be interpreted to always include at least some physical, non-transitory hardware such as a part of a processor or computer. Two different modules can share the same physical hardware (e.g., two different modules can use the same processor and network interface). The modules described herein can be combined, integrated, separated, and/or duplicated to support various applications. Also, a function described herein as being performed at a particular module can be performed at one or more other modules and/or by one or more other devices instead of or in addition to the function performed at the particular module. Further, the modules can be implemented across multiple devices and/or other components local or remote to one another. Additionally, the modules can be moved from one device and added to another device, and/or can be included in both devices.

The subject matter described herein can be implemented in a computing system that includes a back-end component (e.g., a data server), a middleware component (e.g., an application server), or a front-end component (e.g., a client computer having a graphical user interface or a web browser through which a user can interact with an implementation of the subject matter described herein), or any combination of such back-end, middleware, and front-end components. The components of the system can be interconnected by any form or medium of digital data communication, e.g., a communication network. Examples of communication networks include a local area network ("LAN") and a wide area network ("WAN"), e.g., the Internet.

Approximating language, as used herein throughout the specification and claims, may be applied to modify any quantitative representation that could permissibly vary without resulting in a change in the basic function to which it is related. Accordingly, a value modified by a term or terms, such as "about," "approximately," and "substantially," are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise.

Certain exemplary embodiments are described to provide an overview of the principles of the structure, function, manufacture, and use of the systems, devices, and methods disclosed herein. One or more examples of these embodiments are illustrated in the accompanying drawings. The features illustrated or described in connection with one exemplary embodiment can be combined with the features of other embodiments. Such modifications and variations are intended to be included within the scope of the present invention. Further, in the present disclosure, like-named components of the embodiments generally have similar features, and thus within a particular embodiment each feature of each like-named component is not necessarily fully elaborated upon.

One skilled in the art will appreciate further features and advantages of the invention based on the above-described embodiments. Accordingly, the present application is not to be limited by what has been particularly shown and described, except as indicated by the appended claims. All publications and references cited herein are expressly incorporated by reference in their entirety.

What is claimed is:

1. A magnetostrictive sensing system, comprising:
   a magnetostrictive sensor including a sensor head extending between a proximal end and a distal end that contains,
      a driving pole having a driving coil coupled thereto that is configured to generate a first magnetic flux in response to a driving current, and
      at least one sensing pole having a sensing coil coupled thereto that is configured to output a first signal based at least upon a measurement of a second magnetic flux resulting from interaction of the first magnetic flux with a target; and
   at least one proximity sensor positioned within the sensor head and secured to the distal end of the sensor head, the at least one proximity sensor being distanced from the driving pole and the sensing pole and configured to output a second signal based upon a gap between the distal end of the sensor head and the target;
   wherein the at least one proximity sensor is positioned such that the first magnetic flux generated by the driving coil and the second magnetic flux measured by the sensing coil are each substantially unchanged by the proximity sensor.

2. The sensing system of claim 1, including a controller in electrical communication with the sensor head and configured to:
receive the first signal and the second signal; and
adjust the first signal using the second signal to determine a gap compensated force applied to the target.

3. The sensing system of claim 2, wherein the force is a torque.

4. The sensing system of claim 1, wherein the at least one proximity sensor comprises at least one of a laser proximity sensor, an optical proximity sensor, a capacitive proximity sensor, a radar proximity sensor, a microwave proximity sensor, and an eddy current proximity sensor.

5. The sensing system of claim 1, comprising at least two proximity sensors arranged approximately symmetrically with respect to the driving pole, wherein the second signal is a combination of signals generated by the at least two proximity sensors.

6. The sensing system of claim 5, wherein the second signal is an average of signals generated by the at least two proximity sensors.

7. The sensing system of claim 5, wherein each of the at least two proximity sensors is a sensor comprising at least one of a laser proximity sensor, an optical proximity sensor, a capacitive proximity sensor, a radar proximity sensor, a microwave proximity sensor, and an eddy current proximity sensor, wherein the first proximity sensor is different from the second proximity sensor.

8. The sensing system of claim 6, wherein the at least two proximity sensors are positioned between the driving pole and the sensing pole or between two sensing poles.

9. A magnetostrictive sensing system, comprising:
a magnetostrictive sensor including a sensor head extending between a proximal end and a distal end that contains,
a driving pole having a driving coil coupled thereto that is configured to generate magnetic flux in response to a driving current, and
at least one sensing pole having a sensing coil coupled thereto that is configured to output a first signal based at least upon a second magnetic flux resulting from interaction of the first magnetic flux with a target; and
at least one proximity sensor positioned outside of the sensor head and coupled substantially rigidly thereto, the at least one proximity sensor configured to output a second signal based upon a gap between the distal end of the sensor head and the target;
wherein the at least one proximity sensor is positioned such that the first magnetic flux generated by the driving coil and the second magnetic flux measured by the sensing coil are each substantially unchanged by the proximity sensor.

10. The sensing system of claim 9, further comprising a bracket configured to receive the sensor head and the at least one proximity sensor for substantially rigidly coupling the at least one proximity sensor to the sensor head.

11. The sensing system of claim 9, including a controller in electrical communication with the sensor head and configured to:
receive the first signal and the second signal; and
adjust the first signal using the second signal to determine a gap compensated force applied to the target.

12. The sensing system of claim 11, wherein the force is a torque.

13. The sensing system of claim 9, wherein the at least one proximity sensor is a sensor comprising at least one of a laser proximity sensor, an optical proximity sensor, a capacitive proximity sensor, a radar proximity sensor, a microwave proximity sensor, and an eddy current proximity sensor.

14. The sensing system of claim 9, comprising at least two proximity sensors arranged approximately symmetrically with respect to the driving pole, wherein the second signal is a combination of signals generated by the at least two proximity sensors.

15. The sensing system of claim 14, wherein the second signal is an average of signals generated by the at least two proximity sensors.

16. The sensing system of claim 14, wherein each of the at least two proximity sensors is a sensor comprising at least one of a laser proximity sensor, an optical proximity sensor, a capacitive proximity sensor, a radar proximity sensor, a microwave proximity sensor, and an eddy current proximity sensor, wherein the first proximity sensor is different from the second proximity sensor.

17. The sensing system of claim 14, wherein the at least two proximity sensors are positioned between the driving pole and the sensing pole.

* * * * *